(12) United States Patent
Yamasaki et al.

(10) Patent No.: US 9,224,916 B2
(45) Date of Patent: Dec. 29, 2015

(54) SEMICONDUCTOR LIGHT EMITTING DEVICE

(75) Inventors: Hironori Yamasaki, Fukuoka-ken (JP); Yukie Nishikawa, Fukuoka-ken (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 42 days.

(21) Appl. No.: 13/614,124

(22) Filed: Sep. 13, 2012

(65) Prior Publication Data

US 2013/0126919 A1    May 23, 2013

Related U.S. Application Data

(60) Provisional application No. 61/563,081, filed on Nov. 23, 2011.

(51) Int. Cl.
| | |
|---|---|
| H01L 33/22 | (2010.01) |
| H01L 33/44 | (2010.01) |
| H01L 33/00 | (2010.01) |
| H01L 33/38 | (2010.01) |
| H01L 33/40 | (2010.01) |

(52) U.S. Cl.
CPC ................ *H01L 33/22* (2012.01); *H01L 33/44* (2013.01); *H01L 33/0079* (2013.01); *H01L 33/38* (2013.01); *H01L 33/405* (2013.01)

(58) Field of Classification Search
CPC .................. H01L 33/22; H01L 33/00–33/648
USPC .......... 257/79–103; 438/22–47; 313/498–512
See application file for complete search history.

(56) References Cited

U.S. PATENT DOCUMENTS

| | | | | |
|---|---|---|---|---|
| 4,405,405 | A | * | 9/1983 | Fujii et al. .......................... 216/2 |
| 5,701,025 | A | | 12/1997 | Yoshimori |
| 5,923,054 | A | * | 7/1999 | Kobashi et al. ............... 257/103 |
| 6,900,473 | B2 | * | 5/2005 | Yoshitake et al. ............... 257/95 |
| 7,476,910 | B2 | * | 1/2009 | Fujimoto et al. ................ 257/95 |
| 7,579,205 | B2 | * | 8/2009 | Ikeda et al. ..................... 438/46 |

(Continued)

FOREIGN PATENT DOCUMENTS

| | | |
|---|---|---|
| CN | 1652367 A | 8/2005 |
| CN | 101075652 A | 11/2007 |

(Continued)

OTHER PUBLICATIONS

Japanese Office Action received in corresponding JP Application No. 2012-195558 dated Nov. 26, 2013, and an English translation thereof.

(Continued)

*Primary Examiner* — Matthew Landau
*Assistant Examiner* — Eric Ward
(74) *Attorney, Agent, or Firm* — White & Case LLP

(57) ABSTRACT

According to an embodiment, a semiconductor light emitting device includes a first semiconductor layer, a second semiconductor layer, a dielectric film and an electrode. The first semiconductor layer is capable of emitting light. The second semiconductor layer has a first major surface in contact with the first semiconductor layer and a second major surface opposite to the first major surface, the second major surface including a first region having convex structures and a second region not having the convex structures. The dielectric film is provided at least at a tip portion of the convex structures, and the electrode is provided above the second region.

18 Claims, 14 Drawing Sheets

(56) References Cited

U.S. PATENT DOCUMENTS

| | | | |
|---|---|---|---|
| 7,791,276 B2 * | 9/2010 | Chou et al. | 313/512 |
| 7,863,630 B2 * | 1/2011 | Takeuchi et al. | 257/88 |
| 8,071,973 B2 * | 12/2011 | Kim | 257/13 |
| 8,507,943 B2 * | 8/2013 | Akiyama et al. | 257/99 |
| 8,772,809 B2 * | 7/2014 | Furuki et al. | 257/98 |
| 2004/0069996 A1 | 4/2004 | Maruyama et al. | |
| 2010/0065813 A1 | 3/2010 | Kondo et al. | |
| 2010/0117109 A1 * | 5/2010 | Unno | 257/98 |
| 2010/0327312 A1 * | 12/2010 | Uemura et al. | 257/103 |
| 2011/0018009 A1 * | 1/2011 | Krumaccher et al. | 257/88 |
| 2011/0024781 A1 * | 2/2011 | Fujimoto et al. | 257/98 |
| 2011/0124139 A1 * | 5/2011 | Chang | 438/40 |
| 2011/0193119 A1 * | 8/2011 | Chen et al. | 257/98 |
| 2011/0291133 A1 | 12/2011 | Tanaka et al. | |
| 2011/0291134 A1 * | 12/2011 | Kang | 257/98 |
| 2012/0018752 A1 | 1/2012 | Fujiwara et al. | |
| 2012/0146072 A1 | 6/2012 | Yamasaki et al. | |
| 2013/0168826 A1 * | 7/2013 | Vineis | 257/618 |

FOREIGN PATENT DOCUMENTS

| | | |
|---|---|---|
| CN | 101075652 A1 | 11/2007 |
| CN | 101218687 A | 7/2008 |
| CN | 101740684 A | 6/2010 |
| JP | 2004-146498 A | 5/2004 |
| JP | 2008-021845 A | 1/2008 |
| JP | 2008-103627 | 5/2008 |
| JP | 2009-206265 | 9/2009 |
| JP | 2010-114337 A | 5/2010 |
| JP | 2011-035017 A | 2/2011 |

OTHER PUBLICATIONS

Taiwanese Office Action issued on Mar. 3, 2014 in corresponding Taiwanese patent application No. 101107489, along with English translation.

Chinese Office Action issued on Dec. 25, 2014 in corresponding Chinese Application No. 201210061934.7, along with English translation thereof.

Chinese Office Action issued on Aug. 25, 2015 in corresponding Chinese Application No. 201210061934.7, along with English translation thereof.

* cited by examiner

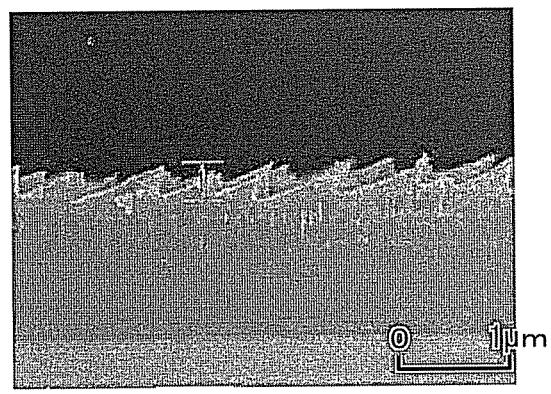
FIG. 5A  DC
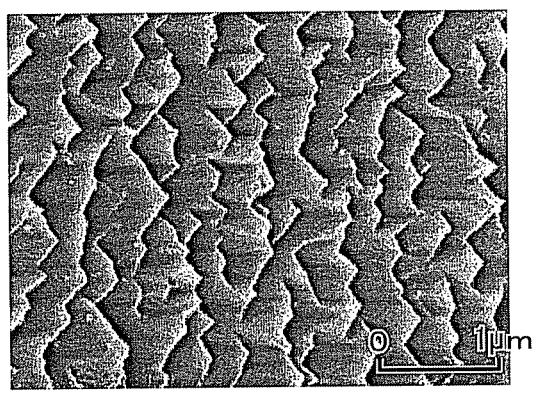
FIG. 5B  DU
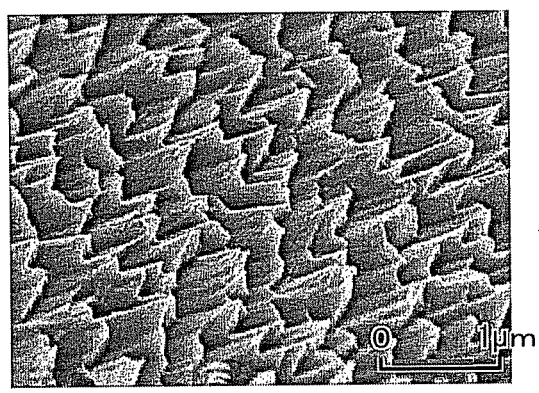
FIG. 5C  DF$_{40}$
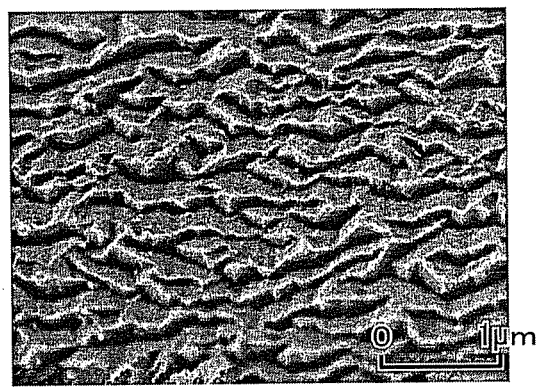
FIG. 5D  DS$_{40}$

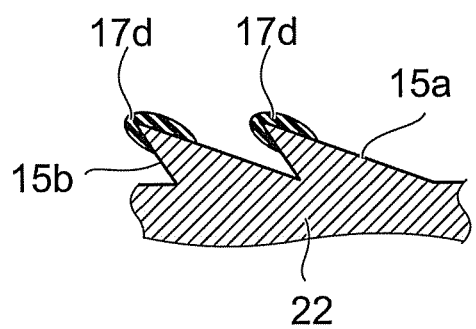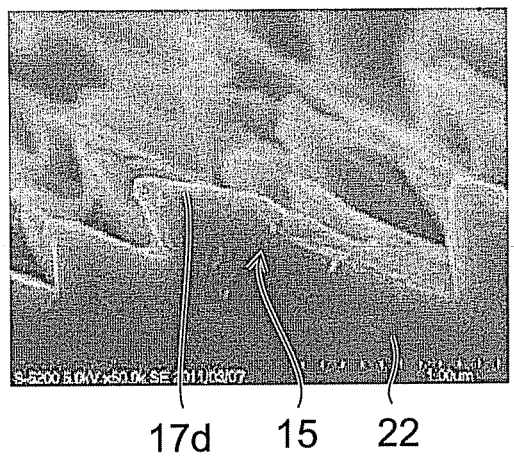
FIG. 6A
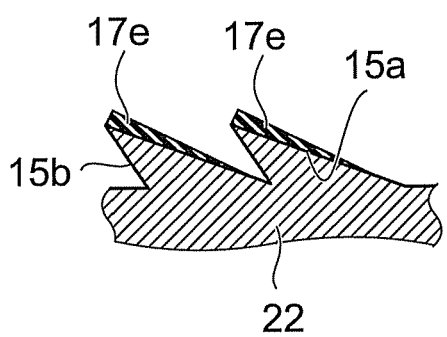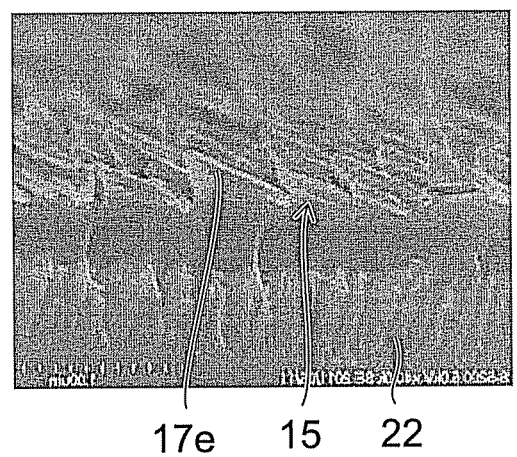
FIG. 6B
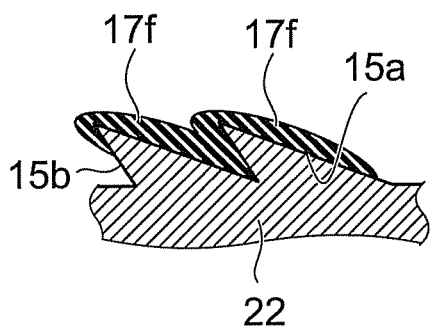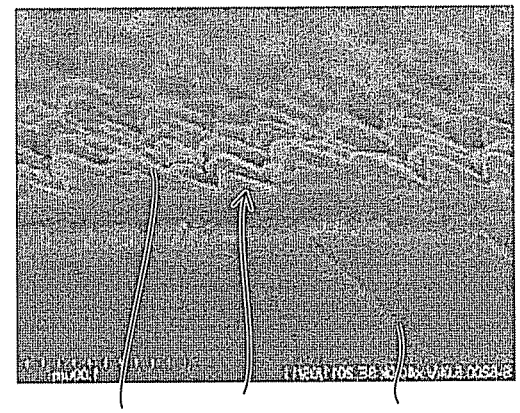
FIG. 6C

SEMICONDUCTOR LIGHT EMITTING DEVICE

CROSS-REFERENCE TO RELATED APPLICATIONS

This application is based upon and claims the benefit of priority from the prior U.S. Provisional Patent Application 61/563,081, filed on Nov. 23, 2011; the entire contents of which are incorporated herein by reference.

FIELD

Embodiments are generally related to a semiconductor light emitting device.

BACKGROUND

Light emitting devices used in illumination devices, display devices, and traffic signals are required to have high optical output and long lifetime. Semiconductor light emitting devices have longer lifetime than conventional bulb light sources and are suitable for these applications.

In a semiconductor light emitting device, fine uneven structures may be provided on the surface of the semiconductor layer on the light emitting surface side. Such fine uneven structures can increase the light extraction efficiency from the semiconductor to the outside and improve the optical output. However, the uneven structures provided on the semiconductor surface may decrease the adhesiveness between the semiconductor light emitting device and the sealing resin provided thereon. In a resin-sealed semiconductor light emitting device, the difference in linear expansion coefficient between the semiconductor and the resin due to heat generation of the light emitting device induces a stress. This stress acts in the direction of peeling the resin from the semiconductor surface. Hence, a gap generated between the semiconductor device and the resin due to decreased adhesiveness lowers the optical output. Thus, there is demand for a semiconductor light emitting device capable of increasing the adhesiveness between the semiconductor surface and the resin to suppress peeling, thereby improving reliability.

BRIEF DESCRIPTION OF THE DRAWINGS

FIG. 5A to 5D are SEM (Scanning Electron Microscope) images of the convex structures provided on the surface of the semiconductor layer;

FIGS. 6A to 6C are schematic cross-sectional views and SEM images of the convex structures with a dielectric film with different thickness;

FIG. 8A shows the light output variation at operation current of 2.5 mA and FIG. 8B shows the light output variation at operation current of 50 mA;

FIG. 10A shows the light output variation at operation current of 2.5 mA and FIG. 10B shows the light output variation at operation current of 50 mA;

DETAILED DESCRIPTION

Figure 1:
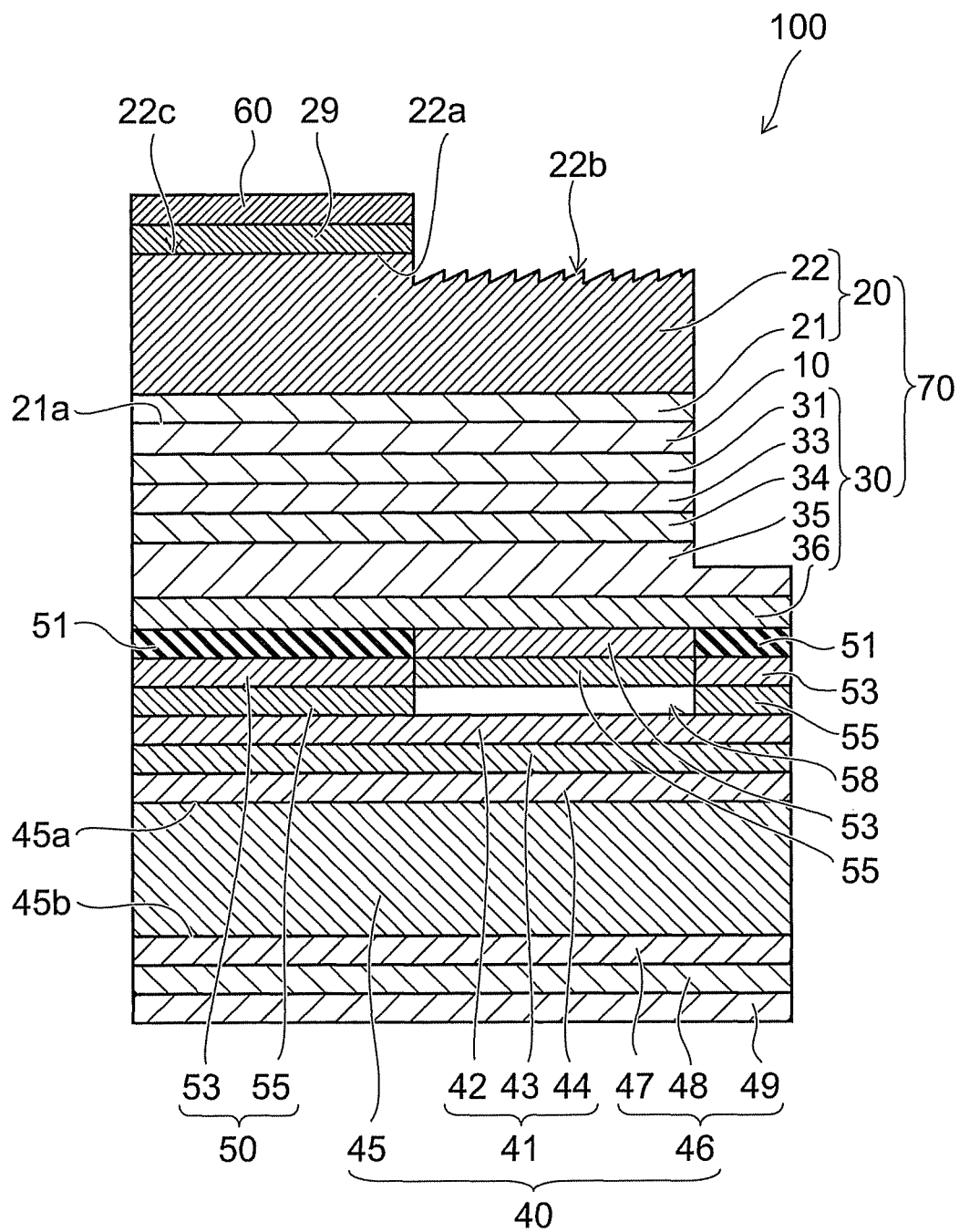
FIG. 1 is a schematic cross-sectional view of a semiconductor light emitting device according to a first embodiment.

According to an embodiment, a semiconductor light emitting device includes a first semiconductor layer, a second semiconductor layer, a dielectric film and an electrode. The first semiconductor layer is capable of emitting light. The second semiconductor layer has a first major surface in contact with the first semiconductor layer and a second major surface opposite to the first major surface, the second major surface including a first region having convex structures and a second region not having the convex structures. The dielectric film is provided at least at a tip portion of the convex structures, and the electrode is provided above the second region.

Embodiments of the invention will now be described with reference to the drawings. Like portions in the drawings are labeled with like reference numerals, with the detailed description thereof omitted as appropriate, and the different portions are described.

First Embodiment

FIG. 1 is a schematic cross-sectional view of a semiconductor light emitting device 100 according to a first embodiment. The semiconductor light emitting device 100 is e.g. a light emitting diode (LED) for emitting visible light.

The semiconductor light emitting device 100 includes a first semiconductor layer 10, a second semiconductor layer 20, and a third semiconductor layer 30. Each of the first semiconductor layer 10, the second semiconductor layer 20, and the third semiconductor layer 30 includes e.g. a compound represented by the composition formula $In_x(Al_y Ga_{1-y})_{1-x}P$ ($0 \leq x \leq 1$, $0 \leq y \leq 1$).

The first semiconductor layer 10 includes a multi-quantum well made of $In_x(Al_y Ga_{1-y})_{1-x}P$ ($0 \leq x \leq 1$, $0 \leq y \leq 1$). The first semiconductor layer 10 emits light induced by a recombination between electrons injected from the second semiconductor layer and holes injected from the third semiconductor layer.

The second semiconductor layer 20 includes an n-type cladding layer 21 and an n-type current spreading layer 22. The n-type cladding layer 21 is provided between the first semiconductor layer 10 and the n-type current spreading layer 22. For instance, the n-type cladding layer 21 is made of $In_{0.5}Al_{0.5}P$ with a thickness of 0.6 µm. The n-type current spreading layer 22 is made of $In_{0.5}(Al_{0.7}Ga_{0.3})_{0.5}P$ with a thickness of 3.5 µm and a carrier concentration of $1.6 \times 10^{18}$ cm$^{-3}$.

The second semiconductor layer 20 has a first major surface and a second major surface opposite the first major surface. The first major surface is the major surface 21a of the n-type cladding layer 21 in contact with the first semiconductor layer 10. The second major surface is a major surface 22a of the n-type current spreading layer 22. In the major surface 22a, the second semiconductor layer 20 includes a first region 22b having convex structures and a second region 22c not having convex structures. Furthermore, in the first region 22b, the second semiconductor layer 20 includes a dielectric film provided at least at the tip of the convex structures.

Furthermore, an electrode 60 is provided above the second region 22c. An n-type contact layer 29 is provided between the electrode 60 and the n-type current spreading layer 22. The carrier concentration of the n-type contact layer 29 is higher than the carrier concentration of the n-type current spreading layer 22. Thus, the n-type contact layer 29 reduces the contact resistance of the electrode 60.

The third semiconductor layer 30 is different in conductivity type from the second semiconductor layer 20. The third semiconductor layer 30 is opposed to the second semiconductor layer 20 across the first semiconductor layer 10. The third semiconductor layer 30 includes a p-type cladding layer 31, a p-type intermediate layer 33, a p-type compositional graded layer 34, a p-type GaP layer 35, and a p-type contact layer 36 in order from the first semiconductor layer 10 side.

For instance, the p-type cladding layer 31 is made of $In_{0.5}Al_{0.5}P$ with a thickness of 0.6 µm. The p-type intermediate layer 33 is made of $In_{0.5}(Al_{0.7}Ga_{0.3})_{0.5}P$ with a thickness of 0.05 µm. The p-type compositional graded layer 34 includes $In_x(Al_yGa_{1-y})_{1-x}P$ with a thickness of 0.03 µm, in which the composition of $In_x(Al_yGa_{1-y})_{1-x}P$ gradually varied from $In_{0.5}(Al_{0.7}Ga_{0.3})_{0.5}P$ to GaP. In the p-type compositional graded layer 34, the composition X varies from 0.5 to 0 (zero), and the composition Y varies from 0.7 to 0 (zero). The p-type GaP layer 35 has a thickness of 0.3 µm. The p-type contact layer 36 is made of GaP with a higher carrier concentration than that of the p-type GaP layer 35 and with a thickness of 0.1 µm.

In the following, the stacked structure including the first semiconductor layer 10, the second semiconductor layer 20, and the third semiconductor layer 30 is referred to as a light emitting structure 70.

The semiconductor light emitting device 100 further includes a support structure 40 for supporting the light emitting structure 70, and a reflection layer 50. The support structure 40 and the electrode 60 are provided on the opposite sides of the light emitting structure 70. The reflection layer 50 is provided between the light emitting structure 70 and the support structure 40. The reflection layer 50 reflects the light emitted from the first semiconductor layer 10 toward the second semiconductor layer 20. The reflection layer 50 is e.g. a stacked layer of ITO (indium tin oxide) 53 and gold (Au) 55. Alternatively, Ag may be used instead of Au. ITO 53 is transparent to the light emitted from the first semiconductor layer 10. The light propagated in ITO 53 is reflected at the surface of Au 55 or Ag.

Furthermore, a current blocking layer 51 is provided between the third semiconductor layer 30 and the reflection layer 50. The current blocking layer 51 blocks current injection in the region overlapping the electrode 60 as viewed from above the light emitting device. In the region not provided with the current blocking layer 51, ITO 53 is in contact with the p-type contact layer 36 and electrically connects the reflection layer 50 with the third semiconductor layer 30.

The current blocking layer 51 is made of e.g. silicon dioxide ($SiO_2$). The current blocking layer 51 blocks the current injection from the reflection layer 50 to the electrode 60. Thus, the current blocking layer 51 suppresses the current flowing in the region of the first semiconductor layer 10 immediately below the electrode 60. This reduces the light emission that is blocked by the electrode 60 and that cannot be extracted outside.

The support structure 40 includes e.g. a p-type silicon substrate 45, a metal bonding layer 41 provided on one major surface 45a side thereof, and a backside electrode 46 provided on the other major surface 45b side. The metal bonding layer 41 is a stacked layer of titanium (Ti) 44, platinum (Pt) 43, and Au 42 in order from the p-type silicon substrate 45 side. Alternatively, the metal bonding layer 41 may be a combination of Ti/Pt/Ti/Au. On the other hand, the backside electrode 46 is also a stacked layer of titanium (Ti) 47, platinum (Pt) 48, and Au 49 in order from the p-type silicon substrate 45 side.

In the process for manufacturing the semiconductor light emitting device 100, the surface of the reflection layer 50 is in contact with the surface of the metal bonding layer 41 to bond the light emitting structure 70 and the p-type silicon substrate 45. For instance, Au 55 of the reflection layer 50 and Au 42 of the metal bonding layer 41 are thermocompressed to form a structure in which the support structure 40 supports the light emitting structure 70. Alternatively, the metal bonding layer 41 may be based on AuIn for using liquid phase diffusion bonding.

As shown in FIG. 1, the reflection layer 50 has a step at the edge of the current blocking layer 51. A gap 58 is formed between the reflection layer 50 and the metal bonding layer 41. As the reflection layer 50 may be thicker than the metal bonding layer 41, the influence of the gap 58 can be eliminated to ensure electrical junction between the support structure 40 and the light emitting structure 70. For instance, the current blocking layer 51 has a thickness of 0.05 µm. For this thickness, the thickness of ITO 53 is set to 0.06 µm, and Au 55 is further stacked thereon.

In the semiconductor light emitting device 100 according to the embodiment, the reflection layer 50 is provided on the support structure 40 side. Thus, the light emitted by the first semiconductor layer is propagated toward the light emitting surface (first region 22b) and emitted outside. Furthermore, convex structures are provided on the light emitting surface 22b. As a result, the light extraction efficiency is increased and the optical output is also increased.

FIGS. 2A to 2E are enlarged schematic cross-sectional views of the convex structures provided on the surface of the n-type current spreading layer 22.

Figure 2A:
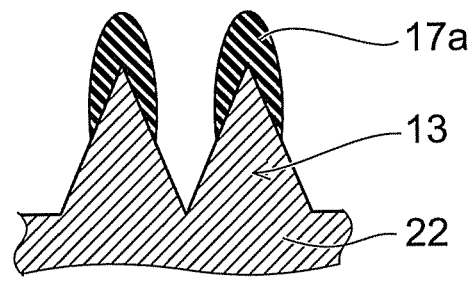
FIGS. 2A to 2E are enlarged schematic cross-sectional views of a convex structure provided on a surface of a semiconductor layer.
Figure 2B:
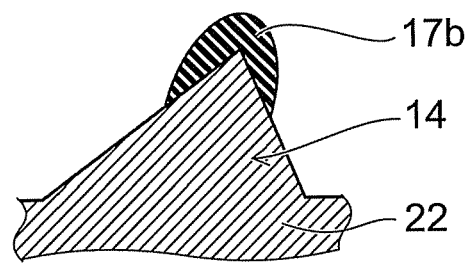
Figure 2C:
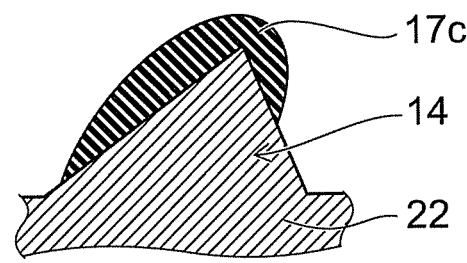
Figure 2D:
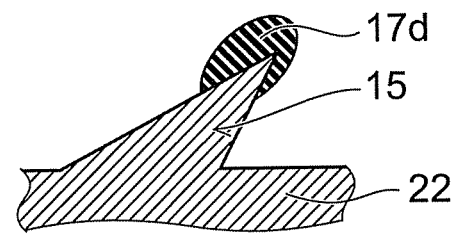
Figure 2E:
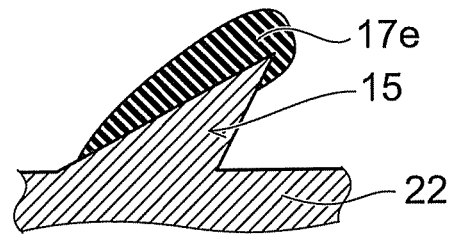

The first region 22b may be provided with e.g. a convex structure 13 having a left-right symmetrical shape shown in FIG. 2A, or a convex structure 14 having an asymmetrical inclined shape shown in FIGS. 2B and 2C. As shown in FIGS. 2D and 2E, the convex structure may be a convex structure 15 having a further inclined shape.

As shown in FIGS. 2A, 2B, and 2D, the dielectric film 17a, 17b, and 17d may be formed at the tip of the convex 13, 14, and 15.

As shown in FIGS. 2C and 2E, the dielectric film 17c and 17e may be formed so as to cover at least one side surface of the convex 14 and 15.

In the foregoing examples, the dielectric film 17a-17e is provided on part of the surface of the convex structures 13-15. However, the dielectric film may be provided entirely on the surface of the convex structures 13-15.

The dielectric film 17a-17e includes e.g. one of silicon dioxide ($SiO_2$), silicon nitride (SiN), and silicon oxynitride (SiON). The dielectric film 17a-17e may be a stacked film including at least two selected from $SiO_2$ film, SiN film, and SiON film. These dielectrics can be formed using e.g. the CVD (chemical vapor deposition) method or the sputtering method.

Figure 3A:
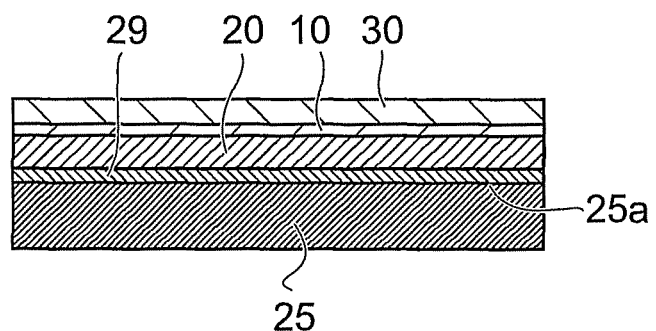
FIGS. 3A to 3C are schematic cross-sectional views of manufacturing processes of the semiconductor light emitting device.
Figure 3B:
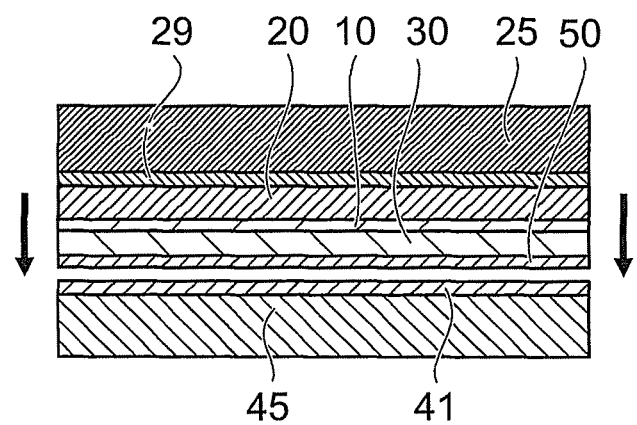
Figure 3C:
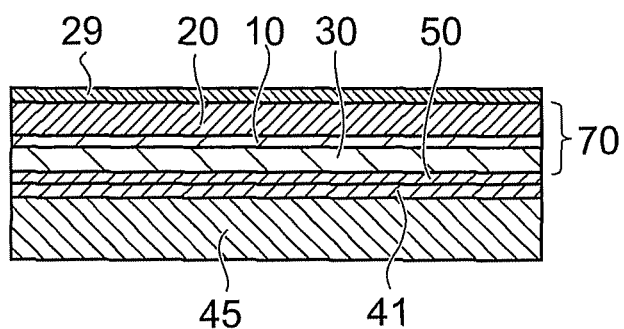
Figure 4A:
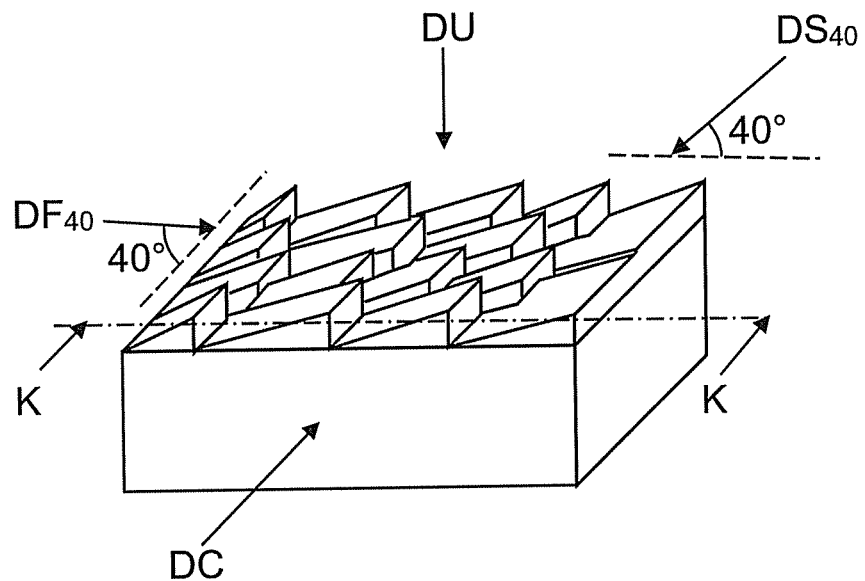
FIG. 4A is a schematic bird view of the convex structures.
Figure 4B:
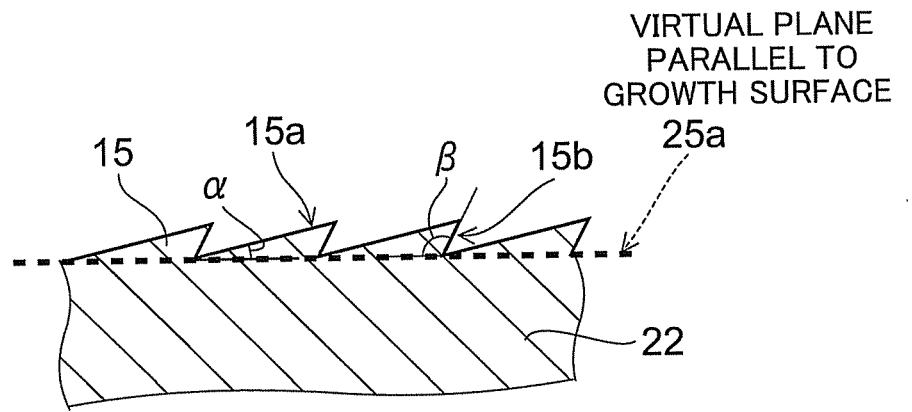
FIG. 4B is a cross-sectional view along a K-K line from DC direction in FIG. 4A.

Next, the convex structure 15 is described with reference to FIGS. 3A to 5D. FIGS. 3A to 3C are schematic cross-sectional views of the manufacturing processes of the semiconductor light emitting device 100. FIG. 4A is a schematic bird view of the convex structure 15. FIG. 4B is a cross-sectional view of the n-type current spreading layer 22 with the convex structure 15 formed thereon. FIGS. 5A to 5D are SEM images of the convex structure 15.

As shown in FIG. 3A, for instance, an n-type contact layer 29, a second semiconductor layer 20, a first semiconductor layer 10, and a third semiconductor layer are sequentially epitaxially grown on a GaAs substrate 25. Each layer is grown using e.g. the MOCVD (metal-organic chemical vapor deposition) method.

The growth surface 25a of the GaAs substrate 25 is tilted from a (100) plane with an angle of between 10 degrees and 20 degrees. That is, the growth surface 25a has an off-angle between 10 degrees and 20 degrees respect to the (100) plane. The plane orientation referred to herein includes equivalent planes. For instance, the (100) plane includes planes represented by (100), (010), (001), (−100), (0−10), and (00−1).

Furthermore, the growth surface 25a is preferably tilted toward the (111) plane. In the case where the semiconductor material is a group III-V compound, the growth surface 25a may be tilted toward either the (111) A plane, which is the group III plane, or the (111) B plane, which is the group V plane.

Next, as shown in FIG. 3B, the reflection layer 50 is in contact with the metal bonding layer 41 to bond the GaAs substrate 25 to the p-type silicon substrate 45. Subsequently, as shown in FIG. 3C, the GaAs substrate 25 is removed, leaving the light emitting structure 70 and the n-type contact layer 29 on the p-type silicon substrate 45.

Next, the n-type contact layer 29 is selectively removed, and the surface (second major surface) of the second semiconductor layer 20 is etched to form a first region 22b. As described above, the second major surface of the second semiconductor layer 20 is the major surface 22a of the n-type current spreading layer 22. The crystal growth surface of the major surface 22a is tilted between 10 degrees and 20 degrees toward the (100) plane. Here, the crystal growth surface means e.g. the macroscopic surface of the n-type current spreading layer 22, where the microscopic structure (such as terraces) resulting from crystal growth is averaged and planarized.

The major surface 22a is etched by using an anisotropic etching method in which the etching rate depends on the plane orientation. Thus, an inclined convex structure 15 can be formed. In the case of the n-type current spreading layer 22 made of $In_{0.5}(Al_{0.7}Ga_{0.3})_{0.5}P$, for instance, the convex structure 15 is formed by wet etching with an aqueous solution containing hydrochloric acid, acetic acid, and hydrofluoric acid.

FIG. 4A is a bird view of the convex structure 15 formed on the n-type current spreading layer 22. FIG. 4B is a schematic cross-sectional view taken along line K-K shown in FIG. 4A.

The convex structure 15 provided on the n-type current spreading layer 22 has a side surface 15a and a side surface 15b along the line K-K. As shown in FIG. 4B, the side surface 15a is inclined at angle α with respect to the plane parallel to the growth surface 25a. On the other hand, the side surface 15b is inclined at angle β with respect to the plane parallel to the growth surface 25a. Here, the angle α and the angle β are defined as "bottom angles" of the convex structure.

The bottom angles α and β specify the shape of the convex structure 15. In the convex structures 13 and 14 shown in FIGS. 2A to 2C, the bottom angle α and the bottom angle β are 90 degrees or less. On the other hand, in the convex structure 15 shown in FIGS. 2D and 2E, the bottom angle β is 90 degrees or more.

FIG. 5A is a cross-sectional SEM image direction DC along the line K-K shown in FIG. 4A. FIG. 5B is a surface SEM image directly viewed from the light extraction surface (direction DU). FIG. 5C is a SEM image viewed from a direction of 40 degrees obliquely upward on the front side (direction DF40). FIG. 5D is a SEM image viewed from a direction of 40 degrees obliquely upward on the just lateral side (direction DS40). In FIGS. 5A to 5D, the growth surface 25a is the (−100) plane tilted 15 degrees toward the [011] direction.

FIG. 5A shows a cross sectional SEM image of the convex structure 15 as viewed from the direction DC shown in FIG. 4A, and corresponds to the schematic cross sectional view shown in FIG. 4B. The cross-sectional plane as viewed from the direction DC is the (011) plane.

FIG. 5B shows the surface SEM image of the convex structure 15 directly from the light emitting surface 22b (direction DU).

FIG. 5C shows the SEM image of the convex structure 15 viewed from a direction of 40 degrees obliquely upward on the front side (direction DF40).

FIG. 5D shows the SEM image of the convex structure viewed from the direction of 40 degrees obliquely upward on the lateral side (DS40).

As described above, the convex structure 15 includes the bottom angle of 90 degrees or more with respect to the plane parallel to the growth surface 25a. Thus, the light extraction efficiency of the light emitting surface 22b provided with the convex structure 15 with the bottom angle of 90 degrees or more is higher than that of the light emitting surface 22b provided with the convex structures 13 and 14 (see FIGS. 2A to 2E) with a bottom angle of 90 degrees or less.

The light extraction efficiency of the light emitting surface 22b with the convex structure 15 is 1.45 times or more than that of the light emitting surface with no convex structure. Furthermore, in the light emitting surface 22b with the convex structure 15 with a bottom angle β of 90 degrees or more and a bottom angle α between 35 degrees and 45 degrees, the light extraction efficiency is increased to 1.5 times higher than that in the light emitting surface with no convex structure.

FIGS. 6A to 6C are cross-sectional schematic views and SEM images of the convex structure 15 on which a dielectric film is formed with different thicknesses. Each cross-sectional view schematically shows a dielectric film with a different thickness covering the convex structure 15.

FIG. 6A shows the cross section of the convex structure 15 covered with a dielectric film 17d with a thickness of 50 nm.

In this case, the dielectric film 17d covers only the tip of the convex structure 15. As the dielectric film is provided thicker, the covering area expands on the side surface 15a, 15b of the convex structure 15.

FIG. 6B shows the cross section of the convex structure 15 covered with a dielectric film 17e with a thickness of 100 nm. The dielectric film covers entirely the side surface 15a with a bottom angle of less than 90 degrees. On the other hand, only part of the surface is covered with the dielectric film 17e on the side surface 15b with a bottom angle of more than 90 degrees.

FIG. 6C shows the cross section of the convex structure 15 covered with a dielectric film 17f with a thickness of 400 nm. The dielectric film 17f covers entirely the side surfaces 15a and 15b.

It is desired to increase the adhesiveness between the semiconductor light emitting device 100 and the sealing resin provided thereon, in order to suppress peeling. To this end, for instance, as shown in FIG. 6A, it is preferable that the dielectric film covers at least the tip of the convex structure 15. More preferably, as shown in FIG. 6B, the dielectric film 17e is formed so as to cover entirely the side surface with a bottom angle of 90 degrees or less.

More preferably, as shown in FIG. 6C, the dielectric film covers entirely the side surface of the convex structure 15. On the other hand, if the dielectric film is too thick, the stress of the dielectric film is likely to cause peeling between the n-type current spreading layer 22 and the dielectric film. Thus, the thickness of the dielectric film is preferably set to 500 nm or less. That is, a preferable thickness of the dielectric film covering the convex structure 15 is 50-500 nm. Here, the "thickness of the dielectric film" is the maximum thickness of the dielectric film in the direction perpendicular to the side surface of the convex structure 15.

Next, the result of temperature and humid operation of a light emitting apparatus based on the semiconductor light emitting device 100 is described. The light emitting apparatus (not shown) includes the semiconductor light emitting device 100 bonded to a lead frame 61. The semiconductor light emitting device 100 is sealed from outside by a resin 63.

Figure 7A:
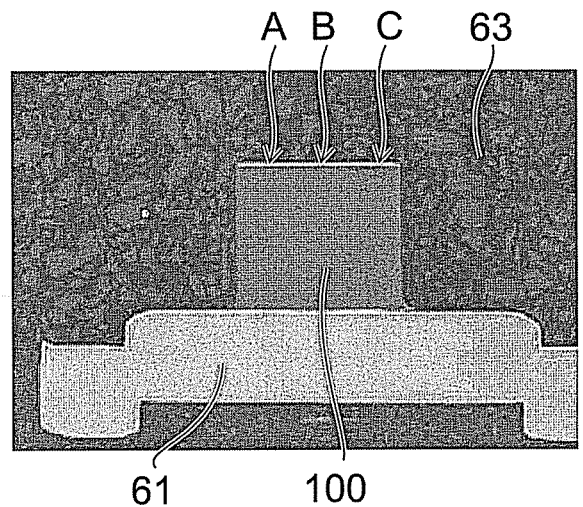
FIG. 7A is a cross-sectional SEM image of the resin-sealed semiconductor light emitting device according to the first embodiment and FIGS. 7B to 7D are enlarged cross-sectional SEM images after the temperature and humid operation.

FIG. 7A is a cross-sectional SEM image of the resin-sealed semiconductor light emitting device 100. The resin 63 is made of epoxy. The refractive index of epoxy resin is 1.55-1.61 and satisfies the following relation to the refractive index $N_1$ (>3.0) of the convex structure 15 (n-type current spreading layer 22) and the refractive index $N_2$ (1.42 for $SiO_2$) of the dielectric film.

$$N_1 > N_2 \text{ and } N_2 < N_3 \quad (1)$$

Here, $N_3$ is the refractive index of the resin. Thus, the decrease of light extraction efficiency due to resin sealing can be suppressed. For instance, the decrease of optical output after resin sealing is suppressed to 2-3%.

Furthermore, as the resin 63, for instance, silicone resin can be used. The refractive index of silicone resin is 1.43. If a SiN film with a refractive index of 1.80 is used as the dielectric film, the following relation is satisfied.

$$N_1 > N_2 > N_3 \quad (2)$$

Thus, the decrease of optical output after resin sealing can be further suppressed.

Figure 7B:
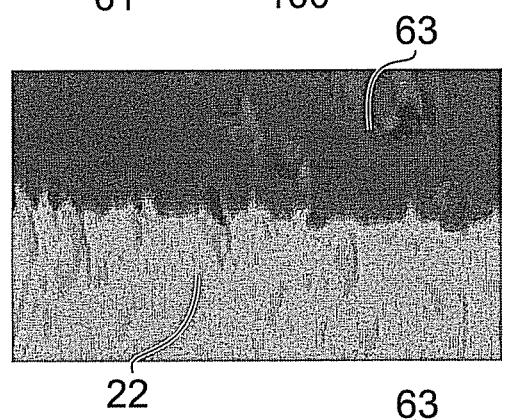
Figure 7C:
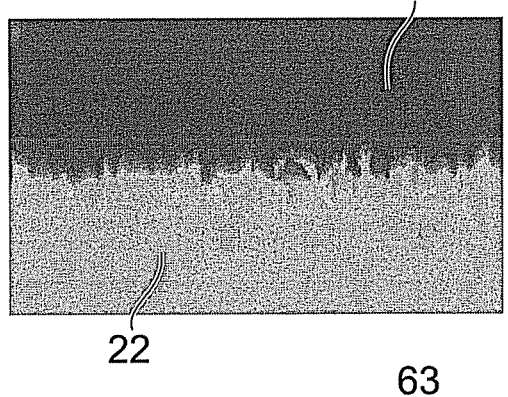
Figure 7D:
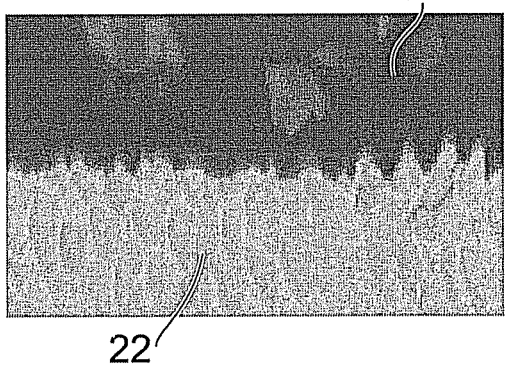

FIGS. 7B to 7D are enlarged cross-sectional SEM images after the temperature and humid operation. FIG. 7B is a SEM image of region A shown in FIG. 7A. FIG. 7C is a SEM image of region B. FIG. 7D is a SEM image of region C.

In the temperature and humid operation, the semiconductor light emitting device 100 was continuously operated under a temperature of 85° C. and a humidity of 85% with an operation current of 85 mA. FIGS. 7B to 7D show cross sections after 1500 hours operation. In any of the SEM images, the n-type current spreading layer 22 and the resin 63 are in close contact.

Figure 8A:
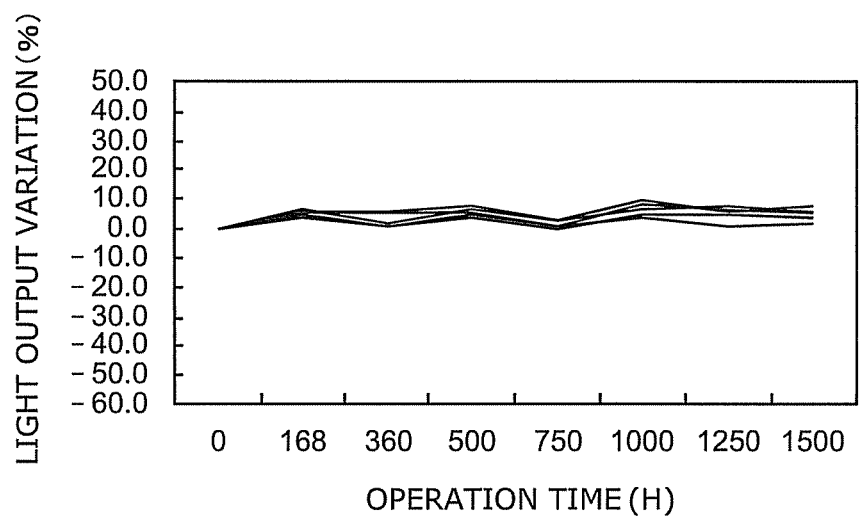
FIGS. 8A and 8B are graphs showing the result of the temperature and humid operation using the semiconductor light emitting device according to the first embodiment.
Figure 8B:
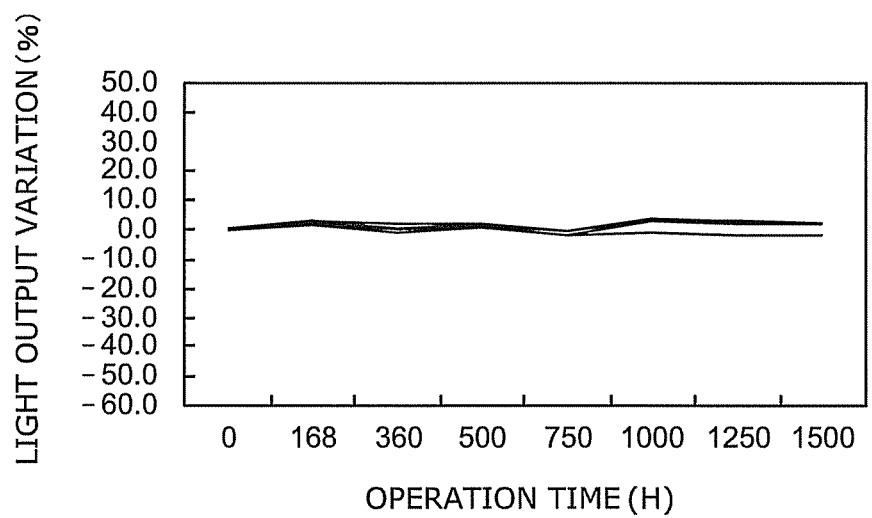

FIGS. 8A and 8B are graphs showing the light output variation of the semiconductor light emitting device 100 in the temperature and humid operation. The vertical axis represents the variation of light output emitted by the semiconductor light emitting device 100. The horizontal axis represents operation time.

FIG. 8A shows the light output variation at an operation current of 2.5 mA. FIG. 8B shows the light output variation at an operation current of 50 mA. In both cases, the light output variation is ±10% or less during the operation. Thus, the semiconductor light emitting device 100 is operated stably.

In contrast, FIGS. 9A to 10B show the result of temperature and humid operation in the case where a semiconductor light emitting device according to a comparative example is used. In the semiconductor light emitting device according to the comparative example, the dielectric film covering the convex structures is not provided.

Figure 9A:
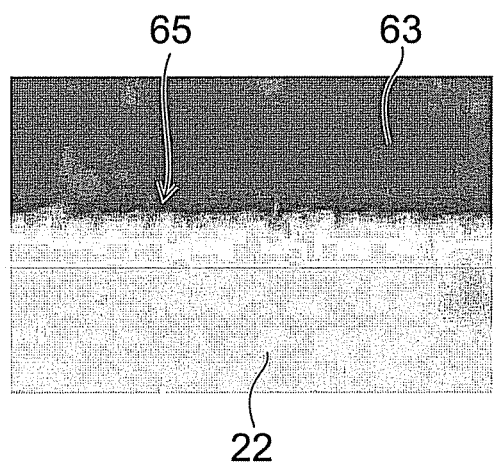
FIGS. 9A to 9C are SEM images after the temperature and humid operation, showing partial cross-section of a semiconductor light emitting device according to a comparative example.
Figure 9B:
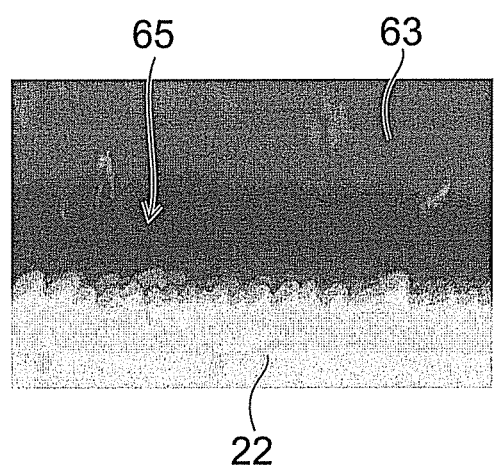
Figure 9C:
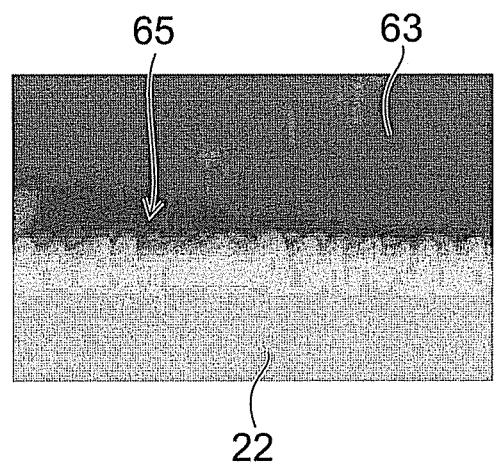

FIGS. 9A to 9C are SEM images of the regions corresponding to A-C shown in FIG. 7A. In each SEM image, it can be seen that the resin 63 is peeled from the n-type current spreading layer 22, forming a gap 65.

Figure 10A:
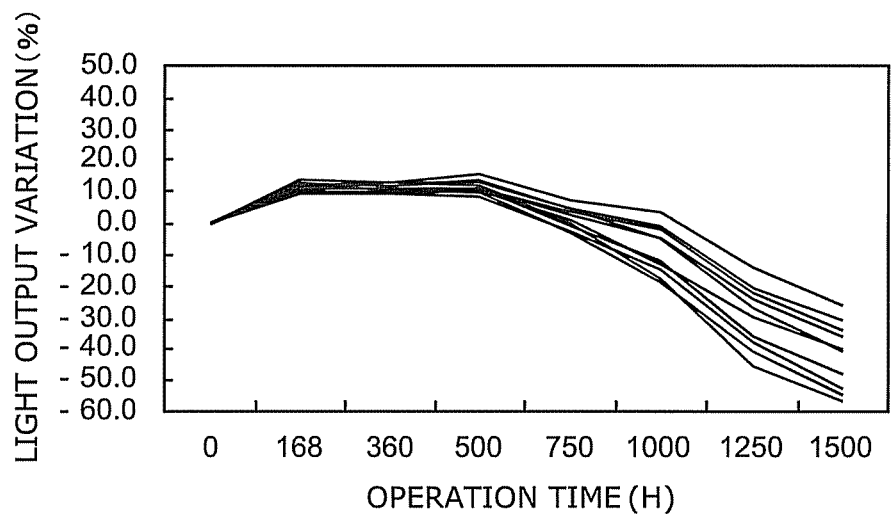
FIGS. 10A and 10B are graphs showing the result of the temperature and humid operation using the semiconductor light emitting device according to the comparative example.
Figure 10B:
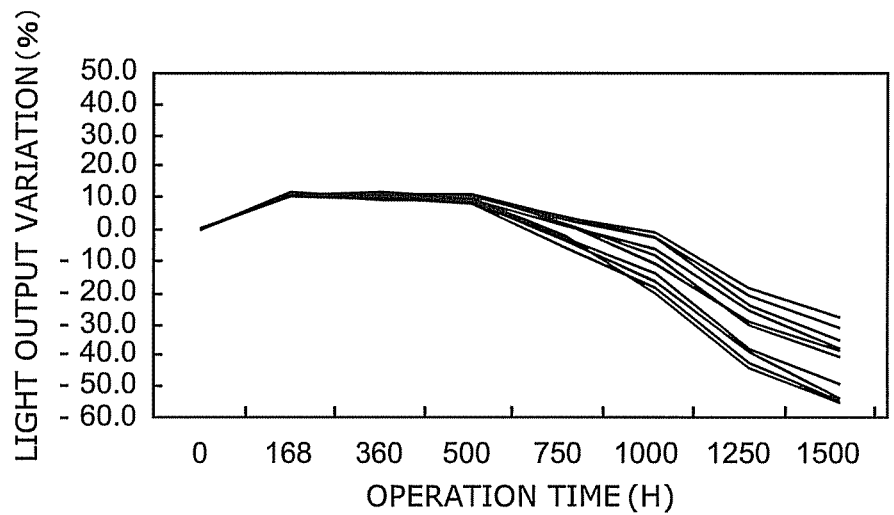

FIGS. 10A and 10B are graphs showing the result of the temperature and humid operation. FIG. 10A shows the light output variation at an operation current of 2.5 mA. FIG. 10B shows the light output variation at an operation current of 50 mA. In both cases, the light output is significantly decreased between 500 hours and 1500 hours. Furthermore, the light output variation at an operation current of 2.5 mA is the same with that at the operation current of 50 mA. This indicates that the decrease of light output is caused not by the degradation of the semiconductor light emitting device, but by the peeling of the resin.

Thus, in the embodiment, a dielectric film is provided on the surface of the convex structure formed on the light emitting surface of the semiconductor light emitting device. This can increase the adhesiveness between the semiconductor light emitting device and the sealing resin provided thereon, and improve the reliability of the semiconductor light emitting device.

Second Embodiment

Figure 11:
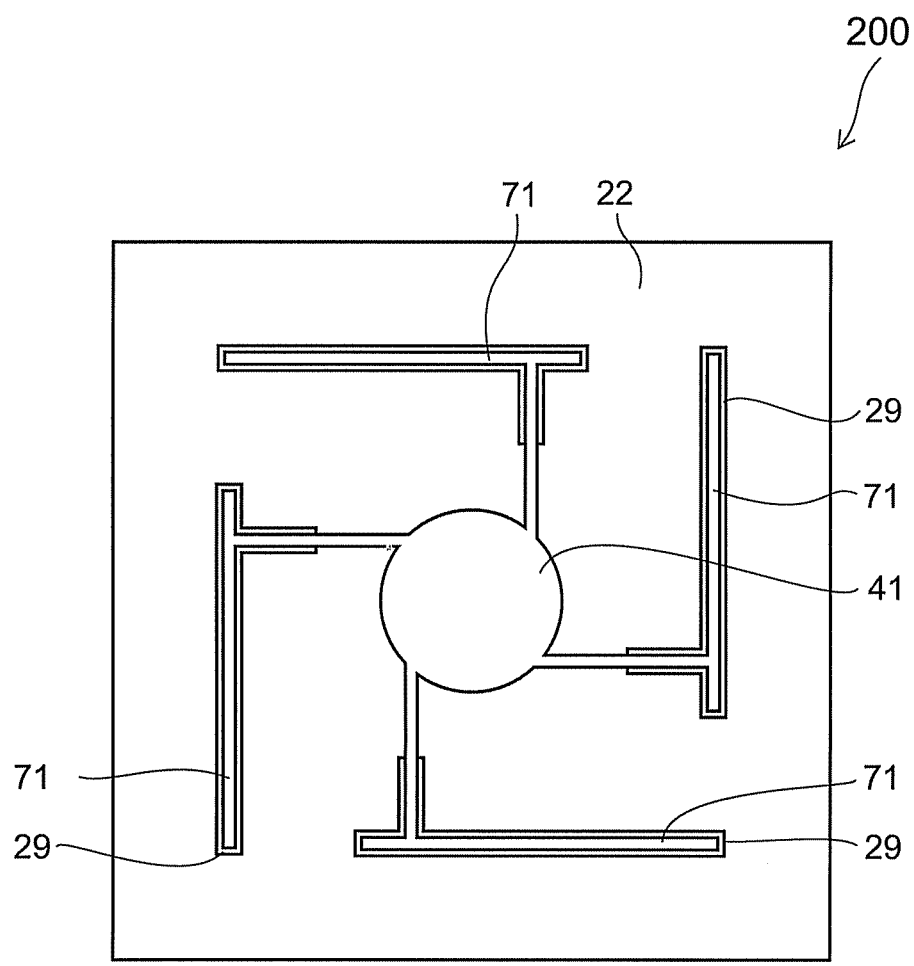
FIG. 11 is a schematic surface view of a semiconductor light emitting device according to a second embodiment.

FIG. 11 is a schematic view of the chip surface of a semiconductor light emitting device 200 according to a second embodiment. The semiconductor light emitting device 200 includes an electrode 60 and a narrow wire electrode 71. The electrode 60 is directly provided above the n-type current spreading layer 22. The narrow wire electrode 71 extends on the major surface 22a (second major surface) of the n-type current spreading layer 22.

The electrode 60 is e.g. a pad electrode. A metal wire (not shown) for connecting the semiconductor light emitting device 200 to an external circuit is bonded to the electrode 60. The narrow wire electrode 71 spreads the current flowing via the electrode 60 over the light emitting surface (first region 22b) of the n-type current spreading layer 22. In the chip surface shown in FIG. 11, the first region 22b is the region where the electrode 60 and the narrow wire electrode 71 are not formed. The convex structures described above are provided on the first region 22b.

FIGS. 12A to 13B are schematic cross-sectional views illustrating the structures of the semiconductor light emitting device 200, and the semiconductor light emitting devices 210-240 according to the variation thereof. The structure other than that of the region shown in these figures is in common with that of the semiconductor light emitting device 100 shown in FIG. 1.

Figure 12A:
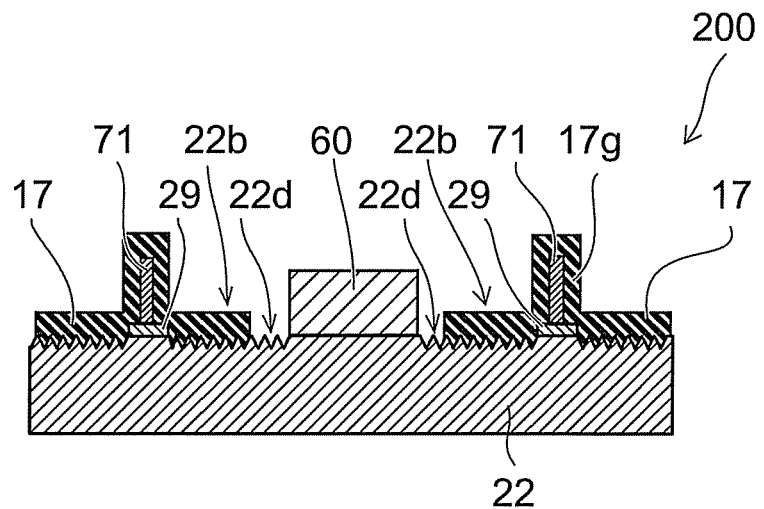
FIGS. 12A to 12C are schematic cross-sectional views of the semiconductor light emitting device according to the second embodiment.

FIG. 12A is a schematic cross-sectional view of the semiconductor light emitting device 200. In the embodiment, the n-type contact layer 29 is not provided between the electrode 60 and the n-type current spreading layer 22. On the other hand, the n-type contact layer 29 is provided between the narrow wire electrode 71 and the n-type current spreading layer 22. Thus, the contact resistance of the narrow wire electrode 71 can be reduced, and the current can be spread throughout the light emitting surface. The contact resistance of the electrode 60 is higher than that of the narrow wire electrode 71. This can suppress the current flowing immediately below the electrode 60 to reduce the ineffective current. As a result, the light emission efficiency of the semiconductor light emitting device 200 can be improved.

In the semiconductor light emitting device 200 shown in FIG. 12A, the dielectric film 17 covers the first region 22*b* of the n-type current spreading layer 22 and the narrow wire electrode 71.

Figure 12B:
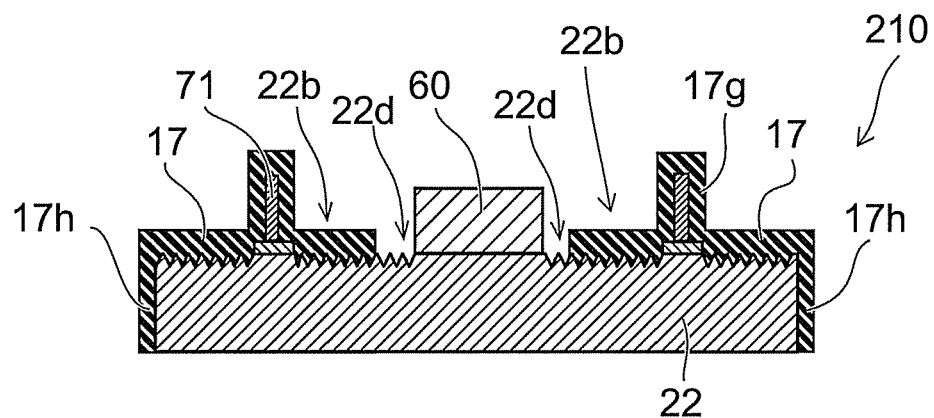

In the semiconductor light emitting device 210 shown in FIG. 12B, the dielectric film 17 includes a region 17*h* covering the side surface of the chip (at least the side surface of the second semiconductor layer 20), in addition to the region covering the first region 22*b* and the narrow wire electrode 71. The chip side surface is in contact with the first major surface and the second major surface.

Figure 12C:
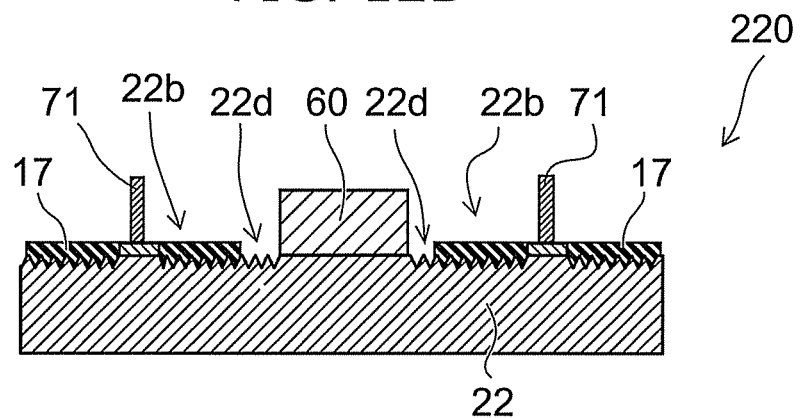

In the semiconductor light emitting device 220 shown in FIG. 12C, the dielectric film 17 covers the first region 22*b*, but is not provided on the narrow wire electrode 71. For instance, this structure can be made by the process sequence of forming the dielectric film 17 followed by forming the narrow wire electrode 71.

In the all structures shown in FIGS. 12A to 12C, the dielectric film 17 is not formed on the region 22*d* along the outer periphery of the electrode 60. On the convex structure provided in this region 22*d*, the dielectric film is not formed. As the ratio of the area occupied by this region 22*d* in the chip surface is very small, this region 22*d* does not affect the adhesiveness of the resin.

As described above, the dielectric film 17 is provided so as to cover at least the first region 22*b*. More preferably, the dielectric film 17 includes a region covering the narrow wire electrode 71 and the chip side surface. This can further increase the adhesiveness between the resin and the semiconductor light emitting device 200 and 210.

Figure 13A:
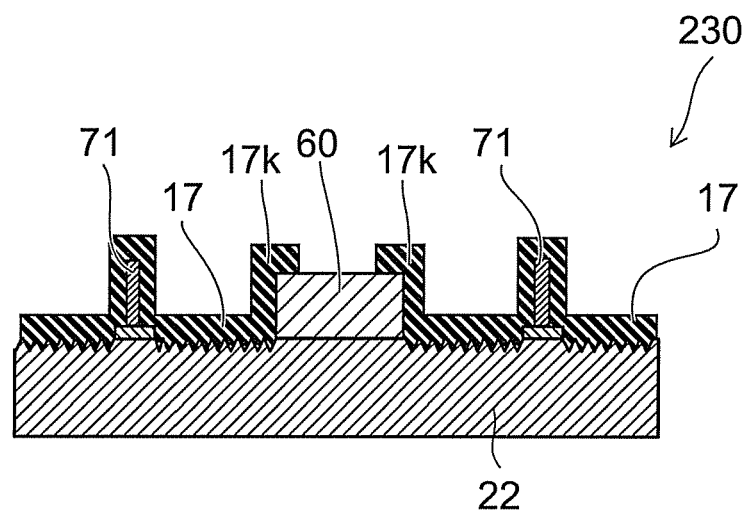
FIGS. 13A and 13B are schematic cross-sectional views of another semiconductor light emitting device according to the second embodiment.

In the semiconductor light emitting device 230 shown in FIG. 13A, the dielectric film 17 includes a region 17*k* covering the outer periphery of the electrode 60, in addition to the first region 22*b* and the narrow wire electrode 71. The dielectric film 17 covers the step difference at the outer periphery of the electrode 60 to increase the adhesiveness between the electrode 60 and the resin. Thus, peeling of the resin is suppressed. This can prevent e.g. the degradation of the electrode 60 and detachment of the metal wire.

Figure 13B:
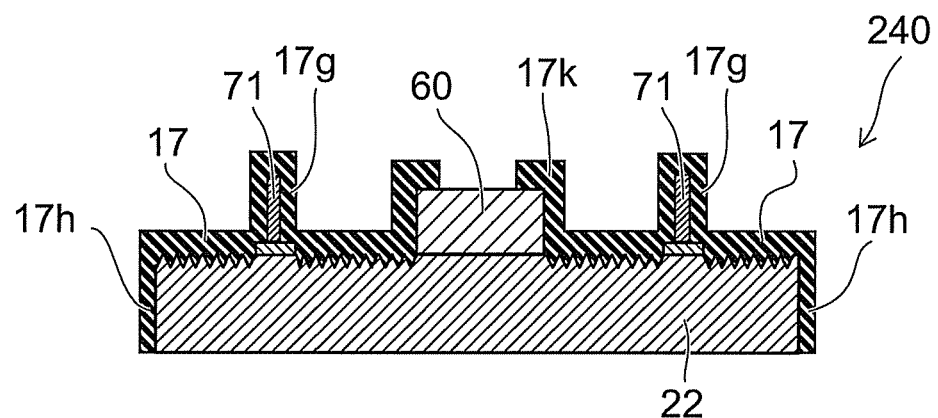

In the semiconductor light emitting device 240 shown in FIG. 13B, the dielectric film 17 includes a region 17*h* covering the side surface of the chip (at least the side surface of the second semiconductor layer 20), in addition to the region covering the first region 22*b*, the narrow wire electrode 71, and the outer periphery of the electrode 60.

In the structures shown in FIGS. 13A and 13B, the dielectric film 17 covers the side surface of the electrode. This suppresses e.g. the corrosion of metal (e.g., melting of Mo) due to penetration of moisture in the electrode of a metal multi-layer.

The structures shown in FIGS. 13A and 13B are effective for the case where, for instance, the electrode 60 has a large area. In this case, when the dielectric film 17 is formed covering the outer periphery of the electrode 60, the bonding region of a metal wire can be ensured at the center. In contrast, the structures shown in FIGS. 12A to 12C are suitable for the case where a bonding region having a sufficient area cannot be ensured, when the dielectric film 17 is formed at the outer periphery of the electrode 60.

Third Embodiment

Figure 14:
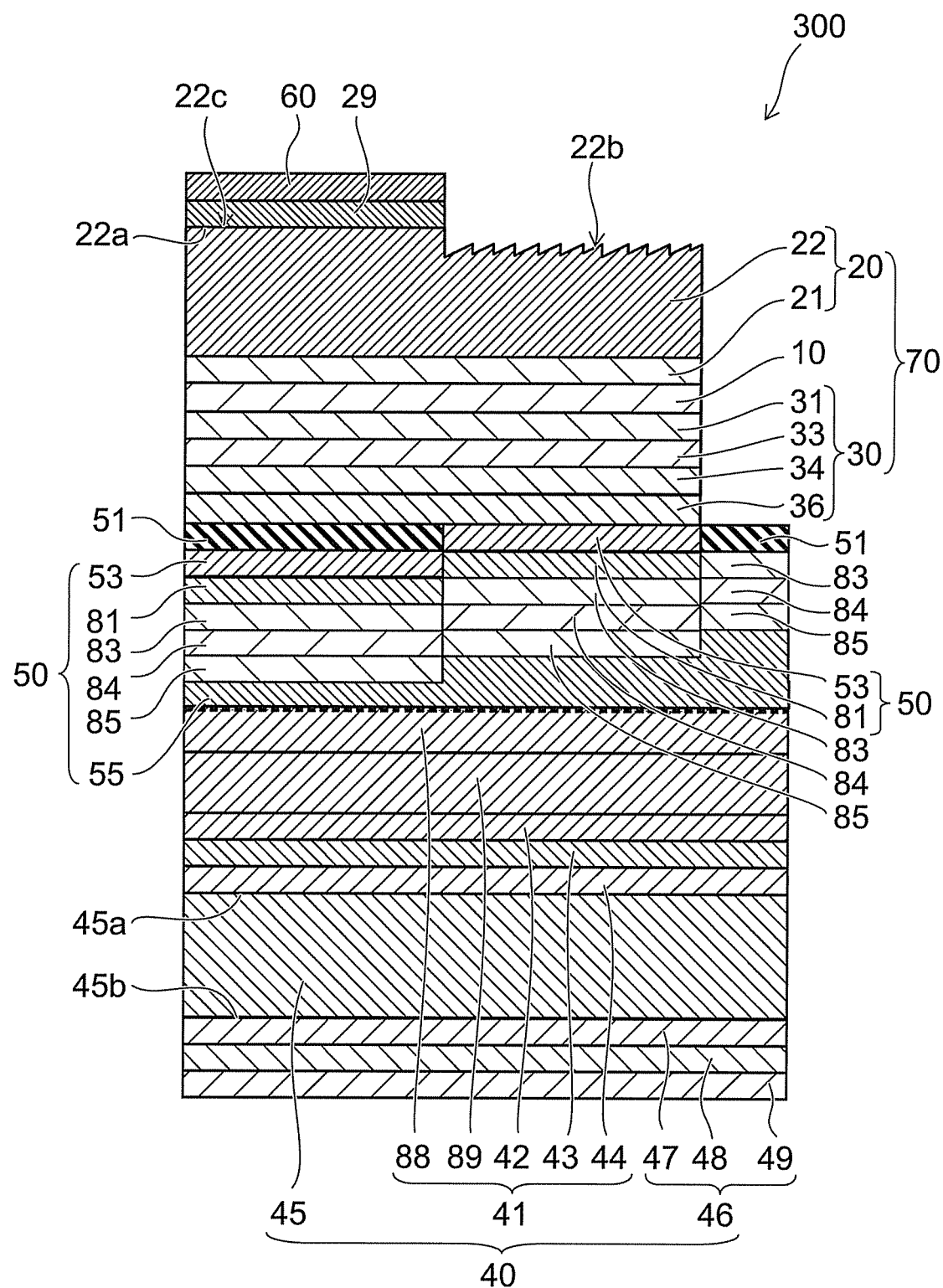
FIG. 14 is a schematic cross-sectional view of a semiconductor light emitting device according to a third embodiment.

FIG. 14 is a schematic cross-sectional view of a semiconductor light emitting device 300 according to a third embodiment. The configuration of the first semiconductor layer 10 and the second semiconductor layer 20 is the same as that of the semiconductor light emitting device 100 shown in FIG. 1. The third semiconductor layer 30 does not include the p-type GaP layer 35. The p-type compositional graded layer 34 is directly connected to the p-type contact layer 36. In the second major surface 22*a* of the second semiconductor layer 20, a first region 22*b* and a second region 22*c* are provided. In the first region 22*b*, convex structures are provided. In the second region 22*c*, an electrode 60 is provided via the n-type contact layer 29.

On the other hand, the reflection layer 50 includes ITO and a silver-indium alloy (AgIn). AgIn has higher reflectance in the visible light region than Au. Thus, the optical output can be made higher than that in the semiconductor light emitting device 100. A current blocking layer 51 is provided between the reflection layer 50 and the light emitting structure 70.

The reflection layer 50 further includes a multi-layer of Ti 83/Pt 84/Ti 85, and Au 55. The multi-layer of Ti/Pt/Ti acts as a barrier layer between AgIn 81 and Au 55 to suppresses interdiffusion. That is, Pt 84 suppresses interdiffusion between Ag, In, and Au. Ti 83 increases the adhesiveness between AgIn 81 and Pt 84. Ti 85 increases the adhesiveness between Pt 84 and Au 55. Au 55 is used as a bonding layer and connects the support structure 40 with the light emitting structure 70.

The support structure 40 includes a p-type silicon substrate 45, a metal bonding layer 41, and a backside electrode 46. The metal bonding layer 41 is provided on the major surface 45*a* of the p-type silicon substrate 45 on the light emitting structure 70 side. The metal bonding layer 41 includes a multi-layer of In 88/Au 89/Ti 42/Pt 43/Ti 44.

In 88 connects between Au 55 and Au 89. Indium contained in In 88 diffuses into both Au 55 and Au 89 to form liquid phase diffusion bonding. The melting point of In is as low as 200° C. or less. For instance, the support structure 40 and the light emitting structure 70 can be bonded at a lower temperature than Au—Au thermocompression without In 88. Furthermore, AuIn in liquid phase and absorbs the step of the reflection layer 50. Hence, a gapless bonding interface can be formed.

Ti 42 increases the adhesiveness between Au 89 and Pt 43. Pt 43 suppresses diffusion of Au into the p-type silicon substrate 45.

Also in this embodiment, a dielectric film is formed on the first region 22*b*. Thus, the adhesiveness between the semiconductor light emitting device 300 and the resin can be increased. The dielectric film only needs to be provided at least at the tip of the convex structures of the first region 22*b*. Preferably, the dielectric film is provided so as to cover entirely the side surface of the convex structures.

In the examples described in the first to third embodiments, the first semiconductor layer 10, the second semiconductor layer 20, and the third semiconductor layer 30 each include $In_x(Al_yGa_{1-y})_{1-x}P$ ($0 \leq x \leq 1$, $0 \leq y \leq 1$). However, the embodiments are not limited thereto. For instance, they may include one of $Al_xGa_{1-x}As$ ($0 \leq x \leq 1$) and $In_xGa_{1-x}As_yP_{1-y}$ ($0 \leq x \leq 1$, $0 \leq y \leq 1$). Furthermore, the embodiments are also applicable to the case of including a compound having the composition represented by $In_xAl_yGa_{1-x-y}N$ ($0 \leq x \leq 1$, $0 \leq y \leq 1$, $x+y \leq 1$).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
a first semiconductor layer capable of emitting light;
a second semiconductor layer provided on the first semiconductor layer, the second semiconductor layer having a first major surface and a second major surface opposite to the first major surface, the second major surface including a plurality of protrusions provided with a first side wall, wherein
the first side wall intersects with a crystal growth plane parallel to the first major surface, and a first internal angle inside the protrusions between the first side wall and the crystal growth plane is more than 90 degrees;
a dielectric film provided at least at a tip portion of the protrusions; and
a third semiconductor layer in contact with the first semiconductor layer, opposite to the second semiconductor layer across the first semiconductor layer and having different conductivity type from the second semiconductor layer, wherein
each of the first semiconductor layer, the second semiconductor layer, and the third semiconductor layer includes one of compounds with compositions represented by $In_x(Al_yGa_{1-y})_{1-x}P$ ($0 \leq x \leq 1$, $0 \leq y \leq 1$), $Al_xGa_{1-x}As$ ($0 \leq x \leq 1$), and $In_xGa_{1-x}As_yP_{1-y}$ ($0 \leq x \leq 1$, $0 \leq y \leq 1$).

2. The device according to claim 1, wherein the protrusions have a second side wall intersecting with the crystal growth plane, and the first side wall faces a second internal angle between the second side wall and the crystal growth plane that is 35 degrees or more and 45 degrees or less.

3. The device according to claim 2, wherein the dielectric film is provided at least on the second side wall.

4. The device according to claim 1, wherein the dielectric film is provided on entire surfaces of the protrusions.

5. The device according to claim 1, wherein the dielectric film includes at least one material selected from silicon dioxide, silicon nitride, and silicon oxynitride.

6. The device according to claim 1, wherein the dielectric film includes at least two films selected from silicon dioxide film, silicon nitride film, and silicon oxynitride film.

7. The device according to claim 1, further comprising:
a resin covering the protrusions and the dielectric film,
wherein refractive index $N_1$ of the second semiconductor layer, refractive index $N_2$ of the dielectric film, and refractive index $N_3$ of the resin satisfy the following relation $N_1 > N_2 > N_3$.

8. The device according to claim 1, further comprising:
a resin covering the protrusions and the dielectric film,
wherein refractive index $N_1$ of the second semiconductor layer, refractive index $N_2$ of the dielectric film, and refractive index $N_3$ of the resin satisfy the following relation $N_1 > N_2$ and $N_2 < N_3$.

9. The device according to claim 1, wherein a maximum thickness of the dielectric film is between 50 nm and 500 nm.

10. The device according to claim 1, wherein the second major surface includes one of the crystal growth planes tilted from a {100} plane with an angle between 10 degrees and 20 degrees.

11. The device according to claim 10, wherein the second major surface is tilted from the {100} plane toward a (111) group III plane or a (111) group V plane.

12. The device according to claim 1, wherein the dielectric film covers an outer periphery of the electrode.

13. The device according to claim 1, wherein
the second semiconductor layer has a side surface in contact with the first major surface and the second major surface, and
the dielectric film covers at least part of the side surface.

14. The device according to claim 12, further comprising:
a narrow wire electrode extending along the second major surface from the electrode,
wherein the dielectric film covers the narrow wire electrode.

15. The device according to claim 1, further comprising:
an electrode provided above the second major surface; and
a narrow wire electrode extending along the second major surface from the electrode,
wherein the dielectric film covers the narrow wire electrode.

16. The device according to claim 1, further comprising:
a support structure provided on a side of the third semiconductor layer opposite to the first semiconductor layer, and supporting the first semiconductor layer, the second semiconductor layer, and the third semiconductor layer; and
a reflection layer provided between the third semiconductor layer and the support structure, and reflecting light emitted from the first semiconductor layer toward the second semiconductor layer.

17. The device according to claim 16, wherein a current blocking layer is selectively provided below the electrode, and formed between the third semiconductor layer and the reflection layer.

18. A semiconductor light emitting device comprising:
a first semiconductor layer capable of emitting light;
a second semiconductor layer provided on the first semiconductor layer, the second semiconductor layer having a first major surface and a second major surface opposite to the first major surface, the second major surface including a plurality of protrusions provided with a first side wall, wherein
the first side wall intersects with a crystal growth plane parallel to the first major surface, and a first internal angle inside the protrusions between the first side wall and the crystal growth plane is more than 90 degrees;
a dielectric film provided at least at a tip portion of the protrusions; and
a third semiconductor layer in contact with the first semiconductor layer, opposite to the second semiconductor layer across the first semiconductor layer and having different conductivity type from the second semiconductor layer, wherein each of the first semiconductor layer, the second semiconductor layer, and the third semiconductor layer includes a compound with a composition represented by $In_xAl_yGa_{1-x-y}N$ ($0 \leq x \leq 1$, $0 \leq y \leq 1$, $x+y \leq 1$).

* * * * *